United States Patent
Goossen et al.

[19]

[11] Patent Number: 5,949,561
[45] Date of Patent: Sep. 7, 1999

[54] WAVELENGTH DEMULTIPLEXING MULTIPLE QUANTUM WELL PHOTODETECTOR

[75] Inventors: Keith Wayne Goossen, Aberdeen, N.J.; Ronald E. Leibenguth, Palmerton, Pa.

[73] Assignee: Lucent Technologies Inc., Murray Hill, N.J.

[21] Appl. No.: 08/834,461

[22] Filed: Apr. 15, 1997

[51] Int. Cl.$^6$ .................................................. H04S 14/02
[52] U.S. Cl. ............................ 359/124; 359/159; 247/97
[58] Field of Search ..................... 359/189, 188, 359/193, 194, 195; 257/97, 188, 189

[56] References Cited

U.S. PATENT DOCUMENTS

| | | | |
|---|---|---|---|
| 4,301,463 | 11/1981 | Burrus, Jr. et al. | 257/189 |
| 5,299,045 | 3/1994 | Sekiguchi | 359/188 |
| 5,780,867 | 7/1998 | Fritz | 257/97 |
| 5,790,581 | 8/1998 | Nitta | 372/50 |

OTHER PUBLICATIONS

Campbell et al., "Improved Two–Wavelength Demultiplexing InGaAsP Photodetector," IEEE J. Quantum Elect. vol. QE–16., No. 6, pp. 601–603, Jun. 1980.

*Primary Examiner*—Rafael Bacares

[57] ABSTRACT

A wavelength demultiplexer having at least two photodetectors is disclosed. The photodetectors are arranged in sequential layers along an optical path. The photodetectors differ in bandgap, and are arranged so that the optical signal passes through relatively larger bandgap photodetectors before being received by relatively smaller bandgap detectors. Each photodetector absorbs photons within a predetermined energy range and generates a voltage as a function of the absorbed energy. The photodetectors can be used to detect, and hence demultiplex, a wavelength-division-multiplexed signal.

14 Claims, 4 Drawing Sheets

WAVELENGTH DEMULTIPLEXING MULTIPLE QUANTUM WELL PHOTODETECTOR

FIELD OF THE INVENTION

The present invention relates generally to apparatus for demultiplexing optical signals.

BACKGROUND OF THE INVENTION

Optical communications may soon be the standard for high-speed local area networks (LAN). Within a few years, the data rates on such networks will be about one gigabit per second (Gbit/s). As capacity requirements exceed 1 Gbit/s, it may be desirable to use wavelength division multiplexing to increase the aggregate data rate of existing fiber in such LANs.

A multiple vertical cavity surface emitting laser (VCSEL) transmitter operating at 820, 835, 850 and 865 nm has recently been proposed as a WDM source for a LAN. To demultiplex the signal, a complicated arrangement of filters packaged with waveguide splitters was used. See, Aronson et al., "Low-Cost Multimode WDM for Local Area Networks," Postdeadline Session of the 1997 Optical Fiber Communication Conference.

It would be desirable to have a simpler arrangement for demultiplexing such a signal to minimize the cost of such a network.

SUMMARY OF THE INVENTION

A wavelength demultiplexer utilizing at least two photodetectors is disclosed. The photodetectors are sequentially arranged in an optical path. The photodetectors differ in bandgap, and are organized so that the optical signal passes through relatively larger bandgap photodetectors before being received by relatively smaller bandgap detectors. Each photodetector absorbs photons within a predetermined energy range (wavelength) and generates a voltage as a function of the absorbed energy. In this manner, smaller bandgap detectors are filtered by the larger bandgap detectors so that all photodetectors receive a different range of wavelengths. Thus, the photodetectors can be used to detect, and hence demultiplex, a wavelength-division-multiplexed signal.

The photodetectors used in the present demultiplexer utilize multiple quantum well (MQW) material grown via molecular beam epitaxy. The MQW structure of the photodetectors enables the present photodetector-based demultiplexer to detect multiplexed signals that differ in wavelength by as little as 15 nanometers (nm). Conventional photodetector-based demultiplexers utilizing bulk materials cannot be used in conjunction with such close channel spacing. Typically, such conventional devices require channels separated by about 150 nm.

BRIEF DESCRIPTION OF THE DRAWINGS

Further features of the present invention will become more apparent from the following detailed description of specific embodiments thereof when read in conjunction with the accompanying drawings in which.

DETAILED DESCRIPTION OF THE INVENTION

For clarity of presentation, exemplary wavelength demultiplexing photodetectors (WDM-PD) illustrated and described herein include two photodiodes. It should be understood, however, that the present WDM-PD can include, at least conceptually, an infinite number of such photodiodes. Typically, one photodiode is required for each channel to be separated.

Figure 1:
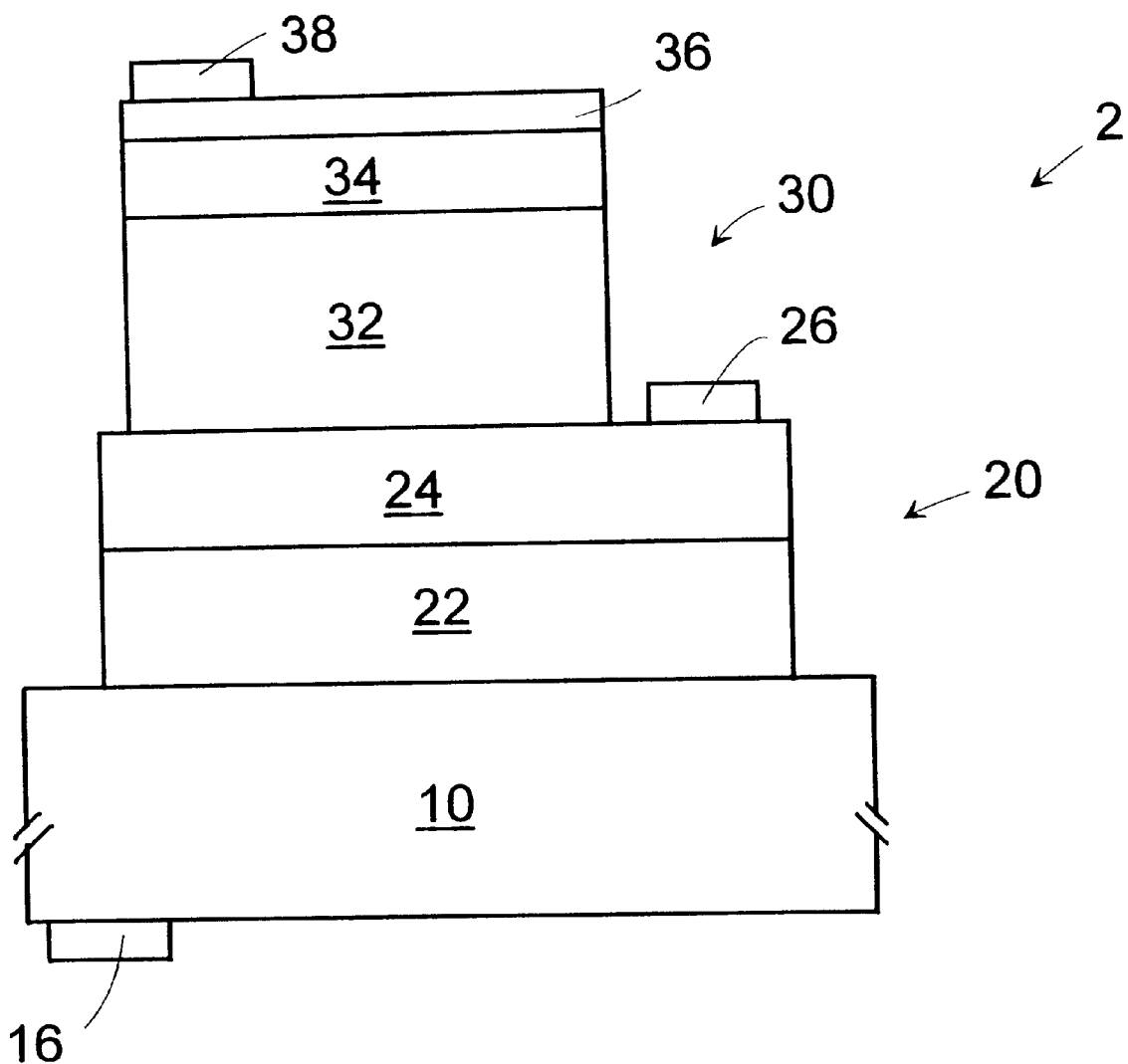
FIG. 1 shows an exemplary structure of a wavelength demultiplexing photodetector according to the present invention.

FIG. 1 shows an exemplary structure of a WDM-PD 2 according to the present invention. A first photodiode 20 is grown on a III-V substrate 10, such as indium phosphide (InP) or gallium arsenide (GaAs). A second photodiode 30 is grown on the first photodiode 10. As will be appreciated by those skilled in the art, substrate selection is dependent upon optical signal wavelength, e.g., InP for long wavelength transmission (about 1300 nm) and GaAs for short wavelength transmission (about 780–850 nm).

The photodiodes comprising the WDM-PD are organized in the following manner. The upstream photodiode, i.e., the first photodiode to receive a wavelength-division-multiplexed signal, has the largest bandgap energy of all the photodiodes in the WDM-PD. Each subsequent photodiode has a smaller bandgap than the photodiode preceding it in the optical path. Upon contact with a photodiode, photons having energies at or above the bandgap of the photodiode are absorbed and lower energy photons are passed to the next photodiode. The process is repeated, with each photodiode absorbing photons having energies at or above that photodiode's bandgap energy. Smaller bandgap photodiodes are thereby filtered by the larger bandgap photodiodes so that all photodiodes receive a different range of wavelengths.

It should be appreciated from the foregoing that the specific structure of a WDM-PD according to the present invention is dependent upon the optical path taken through the WDM-PD. For example, if the substrate or support layer is opaque at the operating wavelengths of the WDM-PD, the wavelength-division-multiplexed signal should enter the device from the "top," so that a photodiode disposed on the substrate is the last to receive the signal. As such, the photodiode disposed on the substrate will have the smallest bandgap energy. In other embodiments, it may be desirable for the wavelength-division-multiplexed signal to enter through the substrate, so that the photodiode disposed on the substrate receives the signal first. In such an embodiment, the photodiode disposed on the substrate has the largest bandgap energy.

With continuing reference to FIG. 1, the photodiode 20 comprises a multiple quantum well (MQW) stack 22 followed by a doped layer 24. The photodiode 20 has the usual p-i-n structure with the substrate 10 as the "n-" layer, the MQW stack 22 being the "i-" (intrinsic) layer, and the doped layer 24 being the "p-" layer. Contacts 16 and 26 are disposed on the substrate 10 and the doped layer 24 to which wires are attached for electrical connection to processing electronics.

It will appreciated that the substrate 10 shown in FIG. 1 is not an essential element of the WDM-PD. In the embodiment of a WDM-PD shown in FIG. 1, the substrate 10 functions as a support, as well as the n-layer. A n-layer deposited on glass or other type of mechanical support can suitably be used in place of a n-type substrate.

The MQW stack 22 is a periodic layered structure. The size of the stack, i.e., the number of layers, controls the overall energy absorption. In other words, the layers within the stack are repeated as necessary to achieve a desired amount of energy absorption. The most basic period of an MQW stack consists of a layer of low band gap material, called the well, followed by a layer of higher band gap material, called the barrier. Layer thickness is in the range of the quantum mechanical wavelength of an electron, i.e., about 100 angstroms. The MQW stack produces sharp absorption lines near the band gap, called excitons. Excitons produce an absorption spectrum characterized by very high absorption at the exciton and very low absorption at slightly larger wavelengths, but closely spaced with the exciton. Thus, the present WDM-PD utilizing MQW material can advantageously demultiplex closely spaced wavelength channels.

Moreover, in the present WDM-PD utilizing MQW material, the position (wavelength) of the exciton, which determines operating wavelength of the photodiode, is advantageously determined by well layer thickness, and to a lesser extent by barrier layer thickness. Decreasing well size increases the effective band gap of the MQW. By contrast, in a WDM-PD utilizing bulk materials, such as described by Campbell et al, "Improved Two-Wavelength Demultiplexing InGaAsP Photodetector," IEEE J. Quantum Elec., v. QE-16, no. 6, pp. 601–603, June 1980, chemical composition of the semiconductor layers comprising the photodetector must be altered to change band gap.

Those skilled in the art will appreciate that a variety of materials can be used for the well layers and the barrier layers of the MQW stack 22. In a presently preferred embodiment, the MQW stack 22 employs GaAs well layers and aluminum-arsenide (AlAs) barrier layers. To the inventors' knowledge, such an arrangement advantageously results in the highest absorption and the sharpest excitonic features, thereby enabling the closest wavelength spacing. Barrier layer size is preferably less than about 25 angstroms. At such a size, a relatively high photocurrent collection efficiency is realized resulting in a high conversion of optical to electrical signal. See, Goossen et al., "Electroabsorption in Ultranarrow-Barrier GaAs/AlGaAs Multiple Quantum Well Modulators," Appl. Phys. Lett., v. 64(9), pp. 1071–1073, Feb. 28, 1994, incorporated by reference herein.

Figure 2:
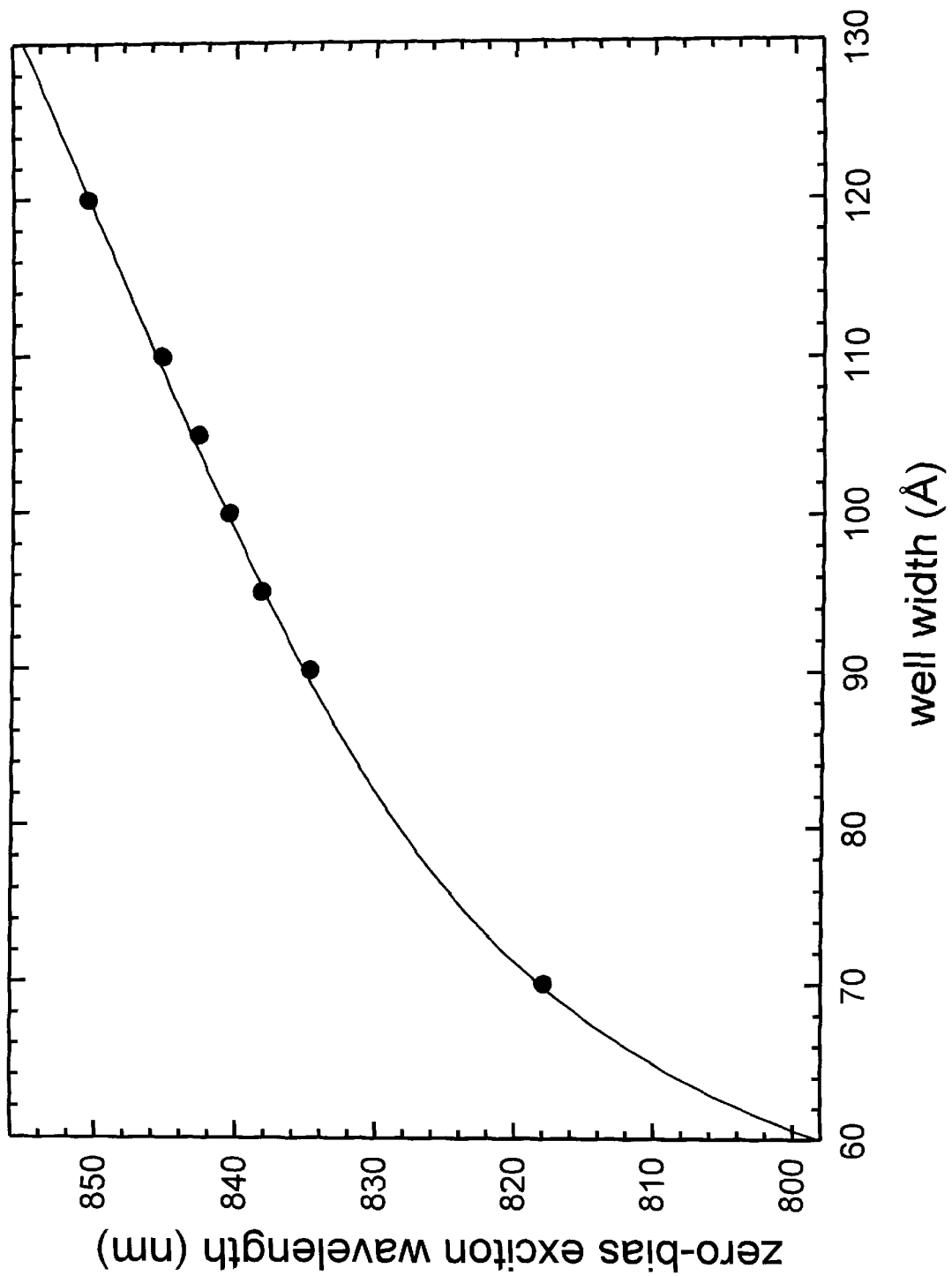
FIG. 2 shows a plot of heavy hole exciton wavelength versus well width.

FIG. 2 is a plot of (heavy hole) exciton wavelength versus well width. The information contained in FIG. 2 can be used to determine well width as a function of the channels of a WDM signal. For example, a WDM-PD suitable for demultiplexing a WDM signal comprising spectral components at 820, 835 and 850 nm would include at least three photodiodes having respective well widths of about 70, 90 and 119 angstroms. The plot shown in FIG. 2 can be represented algebraically by the following expression:

$$\text{exciton wavelength (nanometers)} = 797 + 0.45\,L - (1.2 \times 10^{12})/L^4 \quad [1]$$

where: L equals well width (angstroms).

FIG. 2 is applicable to photodiodes based on MQW stacks having twenty angstrom AlAs barriers and GaAs wells. The curve would change for other barrier compositions, thicknesses, and other well compositions. Curves for such other MQW stacks can be generated experimentally by those skilled in the art.

The MQW stack 22 and the doped layer 24 can be grown using conventional molecular beam epitaxy using solid Group V and Group III sources. See, for example, Swaminathan and Macrander, *Material Aspects of GaAs and InP Based Structures*, pp. 138–155, (Prentice Hall, 1991). It will be appreciated from the foregoing description that the MQW stacks have precise dimensions thereby requiring accurate monitoring of growth. Reflection High Energy Electron Diffraction (RHEED) can be used for that purpose. According to RHEED, an approximately 10 keV narrow electron beam is diffracted at an angle of about 1° off the crystalline semiconductor surface onto a phosphorescent screen. As crystal growth proceeds, at approximately one atomic layer per second, the intensity of the reflected electron beam spot on the phosphorescent screen varies sinusoidally through a maximum at completion of an atomic layer, then through a minimum at half-completion of the next layer, and finally at a maximum as a function of time (through a suitable photocell detector with associated electronics and a recorder). See, Swaminathan and Macrander at 149–155.

The elemental sources contained within the MBE chamber are all controlled to within 1° centigrade; the Group V to Group III beam flux ratio is about 20, the growth temperature is approximately 640° C. and the growth rate is about one micrometer per hour. The sample is rotated during growth.

A second photodiode 30 is grown on the first photodiode 20. The polarity of the second photodiode 30 is flipped relative to the polarity of the first photodiode 20. Adjacent photodiodes, such as the photodiodes 20 and 30, preferably share a layer in common. For example, the doped layer 24 serves as the p-layer for the second photodiode 30, as well as for the first photodiode 20. The intrinsic layer is again a MQW stack 32. A n-layer 34 is disposed on the MQW stack 32. Thus, the exemplary WDM-PD shown in FIG. 1 is arranged n-i-p-i-n. If additional photodiodes are present, the pattern of alternating polarity is simply continued.

If the uppermost photodiode layer tends to oxidize if unprotected, such as, for example, if such layer is comprised of AlGaAs, a cap layer can be disposed thereon. For example, in FIG. 1, cap layer 36 is disposed on the layer 34. A contact 38 is disposed on the cap layer 36 for connection to processing electronics. It should be appreciated that a set of contacts, one of which is preferably shared, is provided for each photodiode in the WDM-PD.

EXAMPLE

A WDM-PD according to the present invention was fabricated. The device included a n-type GaAs substrate, followed by two photodiodes. The photodiode grown on the substrate ("the bottom photodiode) consisted of a MQW stack comprising 75 periods of 120/20 Å GaAs/AlAs followed by a p$^+$ contact layer comprising 8000 Å Al$_{0.11}$Ga$_{0.89}$As. A second photodiode (the top photodiode) having a 200 period MQW stack comprising 70/20 Å GaAs/AlAs followed by a 2000 Å Al$_{0.11}$Ga$_{0.89}$As n layer was grown on the first photodiode. The second photodiode was capped with a 100 Å GaAs n+ layer.

Figure 3:
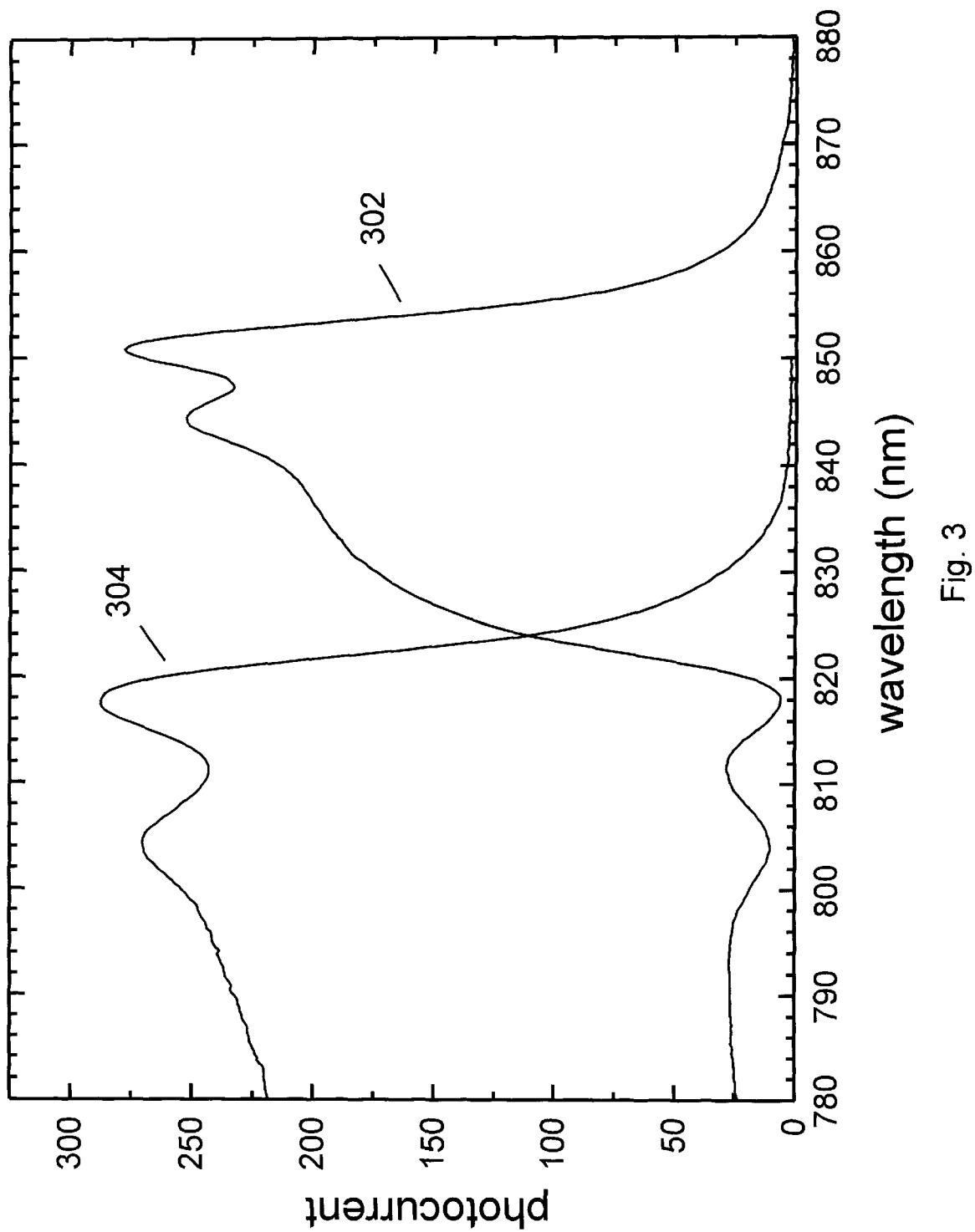
FIG. 3 shows a photo current response spectra of a wavelength demultiplexing photodetector according to the present invention.

A photocurrent spectra of the WDM-PD is shown in FIG. 3. The WDM-PD was illuminated on the surface of cap above the top photodiode. The spectra of the bottom photodiode is identified by the reference numeral 302 and the top photodiode is identified by the reference numeral 304. The spectra was taken at zero bias on the photodiodes.

The MQW stack of the bottom photodiode has a heavy-hole absorption peak at 851 nm, and is low pass filtered by the MQW stack of the top photodiode, which has a heavy-hole absorption peak at 818 nm. For two signals at 818 nm and 833 nm, there is less than −11 dB optical crosstalk between the two photodiodes. The optical crosstalk decreases to −16 dB for two signals at 818 nm and 838 nm.

Due to the quantum-confined Stark effect, if bias is applied, the MQWs absorption edges will red shift. If bias is desired for speed, such red shifting must be considered in MQW design.

Figure 4:
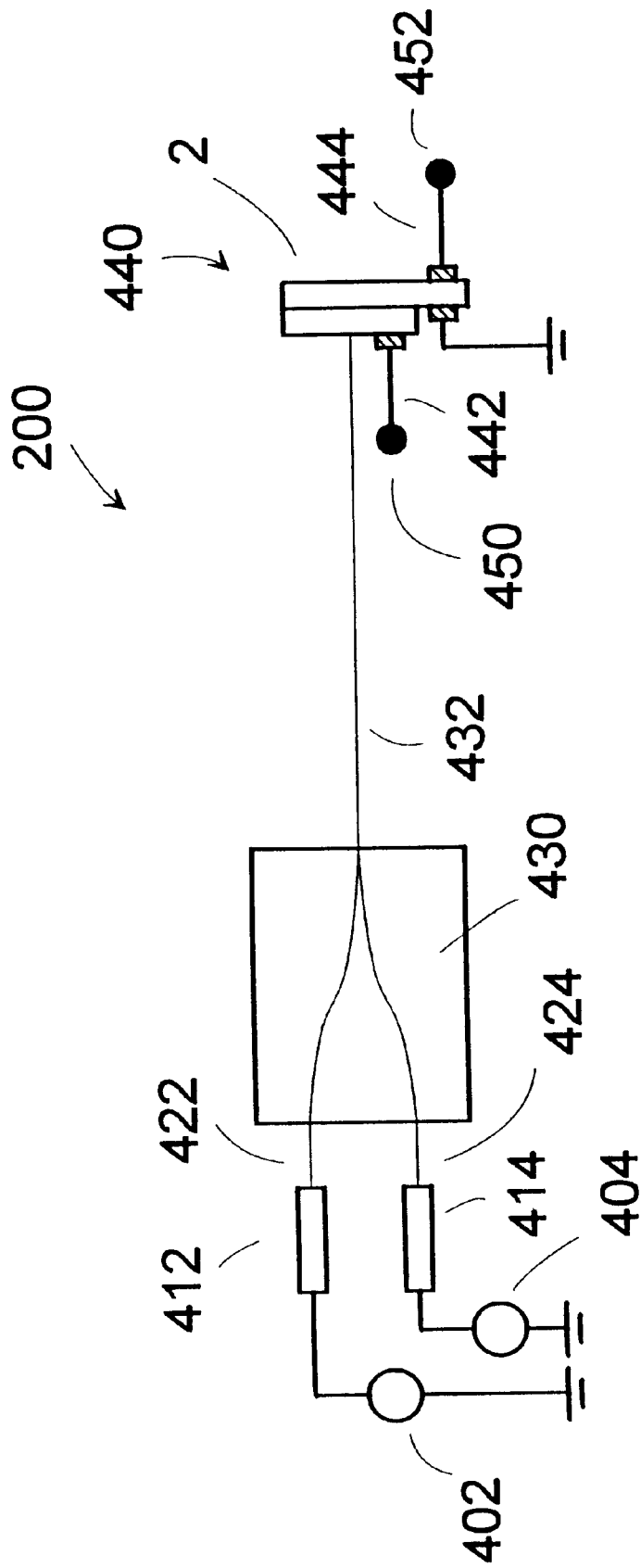
FIG. 4 shows the photodetector of FIG. 1 in use in a local area network.

FIG. 4 shows the exemplary WDM-PD 2 of FIG. 1 in use in a local area network (LAN) 200. The LAN 200 includes two single frequency optical sources, 412 and 414, such as lasers, which are excited by drivers 402 and 404. The optical signals 422 and 424 generated by respective sources 412 and 414 are multiplexed using a suitably configured multiplexer 430, such as a Dragone router or the like. The drivers, optical sources and multiplexer can all be sited in the same location.

A wavelength-division-multiplexed signal 432 leaving the multiplexer is routed to a node 440 wherein a WDM-PD 2 demultiplexes the signal. The WDM-PD 2 generates and routes a first electrical signal 442 corresponding to the spectral component 422 to a first destination 450 and generates and routes a second electrical signal 444 corresponding to the spectral component 424 to a second destination 452.

For ease of explanation, the LAN 200 is shown supporting a wavelength-divisionmultiplexed signal having two channels, i.e., spectral components. It will be appreciated that a signal possessing more than two channels can be suitably supported by appropriately increasing the number of optical sources and the number of photodiodes in the WDM-PD.

Although specific embodiments of the present invention have been described herein, it is to be understood that such embodiments are merely illustrative of the many possible specific arrangements that can be devised in application of the principles of the invention. Numerous and varied other arrangements can be devised in accordance with these principles by those of ordinary skill in the art without departing from the scope and spirit of the present invention.

We claim:

1. A wavelength demultiplexer operable to demultiplex at least a first and a second spectral component of a wavelength-division-multiplexed signal, comprising:
    a first photodiode comprising a first multiple quantum well stack suitable for absorbing the first spectral component; and
    a second photodiode comprising a second multiple quantum well stack suitable for absorbing the second spectral component; wherein,
    the first and second photodiode are characterized by respective first and second bandgaps, and are sequenced so that the photodiode which is first to receive the wavelength-division-multiplexed signal has a larger bandgap than the other photodiode.

2. The wavelength demultiplexer of claim 1 wherein the first multiple quantum well stack has a periodic structure, the period characterized by a first barrier layer having a thickness less than about 25 angstroms and a first well layer, and the second multiple quantum well stack has a periodic structure, the period characterized by a second barrier layer having a thickness less than about 25 angstroms and a second well layer.

3. The wavelength demultiplexer of claim 2 wherein the first and second barrier layers are formed of aluminum arsenide.

4. The wavelength demultiplexer of claim 3 wherein the first and second well layers are formed of gallium arsenide.

5. The wavelength demultiplexer of claim 1, and further wherein the first is disposed on a support, and the second photodiode is disposed on the first photodiode.

6. The wavelength demultiplexer of claim 5, and further wherein the first photodiode first n-layer disposed on the support, a first i-layer disposed on the n-layer, and a disposed on the first i-layer, and the second photodiode comprises the first p-layer, a second i-layer disposed on the first p-layer, and a second n-layer disposed on the second i-layer.

7. The wavelength demultiplexer of claim 6 and further wherein a cap layer is disposed on the second n-layer.

8. The wavelength demultiplexer of claim 6, and further wherein the first n-layer and the support are a n-type substrate.

9. The wavelength demultiplexer of claim 8, and further wherein the substrate is a Group III–V compound semiconductor.

10. The wavelength demultiplexer of claim 9, and further wherein the first and barrier layers are formed of aluminum arsenide, the first and second well layers are gallium arsenide, the first p-layer and the second n-layer are aluminum gallium arsenide.

11. The wavelength demultiplexer of claim 10, and further wherein a cap layer is disposed on the second n-layer to minimize oxidation of the second n-layer.

12. The wavelength demultiplexer of claim 2, and further wherein the first and the second well layers have a first and a second width preselected to obtain the first and the second bandgaps, respectively.

13. The wavelength demultiplexer of claim 12, and further wherein the first and second width are calculated using the expression:

$$SC = 797 + 0.45L - (1.2 \times 10^{12})L^6$$

where: SC is the wavelength, in nanometers, of the spectral component to be absorbed;

L equals well width, in angstroms;

first and second barrier layers are formed of aluminum arsenide and each have a width of 20 angstroms; and the first and the second well layers are formed of gallium arsenide.

14. A local area network capable of supporting a wavelength-division-multiplexed signal, comprising:
    at least two optical sources operable to deliver, respectively, first and second single wavelength optical signals;
    a multiplexer for combining the first and second optical signals into the wavelength-division-multiplexed signal;
    an optical medium for receiving the wavelength-division-multiplexed signal and supporting transmission of the signal;
    a wavelength demultiplexing photodetector comprising:
        a first photodiode comprising a first multiple quantum well stack suitable for absorbing the first single wavelength optical signal; and
        a second photodiode comprising a second multiple quantum well stack suitable for absorbing the second single wavelength optical signal; wherein,
        the first and second photodiode are characterized by respective first and second bandgaps, and are sequenced so that the photodiode which is first to receive the wavelength-division-multiplexed signal has a larger bandgap than the other photodiode; wherein, the wavelength demultiplexing photodetector receives the wavelength-division-multiplexed signal and generates a first electrical signal as a function of the first signal absorbed by the first photodiode, the first electrical signal for transmission to a first processing device, and further generates a second electrical signal as a function of the second signal absorbed by the second photodiode, the second electrical signal for transmission to a second processing device.

* * * * *